(12) United States Patent
Sakaki et al.

(10) Patent No.: US 6,686,987 B1
(45) Date of Patent: Feb. 3, 2004

(54) LIQUID CRYSTAL DISPLAY DEVICE

(75) Inventors: Yoichiro Sakaki, Kashihara (JP); Katsunori Nagata, Yamatokooriyama (JP); Hisao Kawaguchi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/589,290

(22) Filed: Jun. 8, 2000

(30) Foreign Application Priority Data

Jun. 10, 1999 (JP) .......................................... 11-163263
Mar. 9, 2000 (JP) ..................................... 2000-064746

(51) Int. Cl.$^7$ .......................................... G02F 1/1345
(52) U.S. Cl. ...................... 349/149; 349/150; 349/152
(58) Field of Search ................................ 349/149, 150, 349/152

(56) References Cited

U.S. PATENT DOCUMENTS

| | | | |
|---|---|---|---|
| 5,670,994 A | * 9/1997 | Kawaguchi et al. | 349/149 |
| 5,684,555 A | 11/1997 | Shiba et al. | |
| 5,748,179 A | 5/1998 | Ito et al. | |
| 6,052,171 A | * 4/2000 | Kawaguchi | 349/149 |
| 6,133,978 A | * 10/2000 | Tajima | 349/150 |

FOREIGN PATENT DOCUMENTS

| | | |
|---|---|---|
| JP | 3-114820 U | 11/1991 |
| JP | 4-313731 A | 11/1992 |
| JP | 10-214858 A | 8/1998 |
| JP | 411073127 A * | 3/1999 |

* cited by examiner

*Primary Examiner*—Robert H. Kim
*Assistant Examiner*—Hoan Nguyen
(74) *Attorney, Agent, or Firm*—Nixon & Vanderhye PC

(57) ABSTRACT

A liquid crystal display device has a liquid crystal panel and a plurality of TCPs each mounted with a liquid crystal driver IC. Around the liquid crystal driver IC, the TCP has signal input lines for inputting signals to the liquid crystal driver IC, first signal-output lines for feeding output signals of the liquid crystal driver IC to the liquid crystal panel, second signal-output lines for feeding the output signals of the liquid crystal driver IC to the adjacent TCP, power supply lines for driving the liquid crystal driver IC, and counter-electrode lines for feeding counter-electrode signals to the liquid crystal panel. The two counter-electrode lines are electrically connected to each other by means of a jumper chip. The wirings of the TCP are connected with the corresponding electrode terminals of the liquid crystal panel in a belt-shaped terminal connection area.

16 Claims, 8 Drawing Sheets

TERMINAL CONNECTION AREA

TERMINAL CONNECTION AREA

TERMINAL CONNECTION AREA

LIQUID CRYSTAL DISPLAY DEVICE

BACKGROUND OF THE INVENTION

The present invention relates to a liquid crystal display ("LCD") device in which TCPs are mounted on a liquid crystal panel.

Conventionally, the mounting architecture between a liquid crystal panel and driver ICs in an LCD device adopts a TCP (Tape Carrier Package) method chiefly. An LCD device mounted using the TCP method is shown in FIGS. 7A and 7B. FIG. 7A is a schematic perspective view of the LCD device, and FIG. 7B is a schematic enlarged view of a source TCP (or a gate TCP) used in FIG. 7A.

Referring to FIGS. 7A and 7B, the LCD device 500 has, on peripheries of a liquid crystal panel 501, gate TCPs 502 and source TCPs 503 for feeding signals to gate signal lines and source signal lines, respectively, of the liquid crystal panel 501, and external circuit boards 504 for feeding external signals to those TCPs 502, 503.

As shown in FIG. 7B, the gate TCP 502 and the source TCP 503 each have, on a flexible substrate 506, a liquid crystal driver IC 505, signal input lines 507 for feeding external signals (image data signal, IC driving power supply voltage, counter-electrode driving power supply voltage, etc.) to the liquid crystal driver IC 505, and signal-output lines 508 for feeding signals output from the liquid crystal driver IC 505 to the liquid crystal panel 501.

The signal input lines 507 of each TCP 502, 503 are electrically connected to terminals on the circuit boards 504 located outside the liquid crystal panel 501, by which external signals are led from the terminals on the circuit boards 504 to the liquid crystal drivers IC 505.

In this LCD device 500 adopting the TCP method, since signals are supplied directly and individually from the external circuit board 504 to the TCPs 502, 503, a very large number of wirings are necessitated on the external circuit board 504. This has caused hitherto such disadvantages as complicated fabrication process, cost increase and lowered reliability.

Thus, for the TCP method, there has been introduced in recent years a so-called "signal propagation method" in which a signal, after once input to one TCP, is propagated to adjacent TCPs one after another. This method is disclosed in, for example, Japanese Patent Laid-Open Publication HEI 4-313731, Japanese Utility Model Laid-Open Publication HEI 3-114820, and Japanese Patent Laid-Open Publication HEI 10-214858.

A detailed structure of a gate TCP or source TCP mounted on an LCD device adopting the signal propagation method is as follows. That is, on a flexible substrate are mounted a liquid crystal driver IC, signal input lines for inputting external signals to the liquid crystal driver IC, signal-output lines for feeding image signals from the liquid crystal driver IC to the liquid crystal panel, and lines (hereinafter, referred to as "relay lines") for outputting a liquid crystal driving signal to the adjacent TCP.

Meanwhile, connecting lines for connecting adjacent TCPs to each other are provided on peripheral portions of a substrate of the liquid crystal panel, between regions where the TCPs are mounted.

Signal propagation paths between adjacent two TCPs (designated as a first TCP and a second TCP) are explained below.

First, when external signals are fed from the circuit board to a first liquid crystal driver IC via the signal input lines, image signals responsive to these signals are sent to the liquid crystal panel via the liquid crystal driver IC and the signal-output lines.

Meanwhile, part of the external signals inputted to the first TCP are led to the relay lines of the first TCP and then fed to the input signal lines of the second TCP via the connecting lines provided on the liquid crystal panel between these first and second TCPs.

Accordingly, once signals are input from the circuit board to one TCP, part of the signals are supplied to pixels of the liquid crystal panel via the liquid crystal driver IC of the TCP, while the rest of the signals are propagated to adjacent TCPs sequentially via the relay lines of the TCPs and the connecting lines of the liquid crystal panel.

As shown above, the signal propagation method allows the number of wirings, which are necessary for input from the external circuit board to the TCPs, to be considerably reduced, as compared with the TCP method. Thus, this method is effective for cost reduction of circuit boards.

Aforementioned Japanese Patent Laid-Open Publication HEI 4-313731 and Japanese Utility Model Laid-Open Publication HEI 3-114820 suggest that the need of external circuit boards can be eliminated by providing bus lines, which run longitudinally over the entire peripheral part of the liquid crystal panel while bending again and again, in order to propagate signals to the individual TCPs sequentially.

In this manner, the two publications disclose a method for dispensing with the external circuit boards. However, the technique disclosed in these two publications incurs high wiring resistance because of the bus lines being very long. Also, since the wirings of the liquid crystal panel generally need to be provided on a glass substrate, it is inevitable to use wirings much higher in resistance value than those of the external circuit boards or TCPs, resulting in further increase of the wiring resistance. This in return causes problems such as propagation delay of signals. Besides, the publications make no mention of signals that are to be introduced. So, there may occur problems in practical use. In particular, a large voltage drop due to wiring resistance in the power supply voltage for driving the liquid crystal driver IC of the TCP, the power supply voltage for driving counter-electrodes, and the like, may cause operational problems. For prevention of this, signals need to be propagated under low resistance. Thus, for those signals, actually, circuit boards 504 would inevitably be provided as shown in FIG. 8A, where signals are inputted from the circuit boards 504 to the TCPs separately and individually.

Japanese Patent Laid-Open Publication HEI 10-214858 discloses that a power supply voltage line for driving the liquid crystal driver IC extends from one end to the other end of the TCP. In such a case, connecting the power supply voltage lines of the adjacent TCPs to each other makes it possible to dispense with the external circuit boards shown in FIG. 8A. Also, since the connection of the adjacent TCPs to each other is only required, it is unnecessary to form such a long bus line as runs over the entire peripheral part of the liquid crystal panel, as would be involved in the technique disclosed in the foregoing two publications. However, because the third publication does not at all disclose a wiring structure for propagating on the TCP a signal which does not need to be input to the liquid crystal driver IC but which is to be output to the pixel section of the liquid crystal panel, such as for counter-electrode voltage lines, use of such signals would incur inconvenience in the implementation of the technique of this publication. Further, the TCP disclosed in the third publication has a structure that connecting terminals are not arranged along just one side edge of the TCP but a plurality of side edges thereof. On this account, there is a problem that an application process of an anisotropic conductive tape involved in the bonding of the TCPs to the liquid crystal panel is complicated.

SUMMARY OF THE INVENTION

The present invention having been accomplished to solve these and other problems, an object of the invention is to provide an LCD device which dispenses with the external circuit boards to thereby realize reduction in module size and weight at low costs and without incurring any disadvantages or inconveniences.

According to an aspect of the invention, there is provided a liquid display device (LCD) comprising:

a liquid crystal panel having a plurality of electrode terminals provided in a peripheral part thereof and a pixel section provided in a central part thereof; and a plurality of wiring boards each provided with a liquid crystal driver IC and wirings, wherein the wirings comprise first wirings for supplying signals to the pixel section and second wirings contributing to signal transfer and reception between mutually adjacent wiring boards;

the plurality of wiring boards each have one generally belt-shaped terminal connection area extending along one longitudinal edge of the wiring board; and the first wirings are electrically connected to their respective corresponding electrode terminals of the liquid crystal panel in a lengthwise central part of the terminal connection area, while the second wirings are electrically connected to their respective corresponding electrode terminals of the liquid crystal panel in either lengthwise end portion of the terminal connection area.

The LCD device of the present invention is of the signal propagation type. The plurality of wiring boards mounted on the LCD device each have a plurality of connecting terminals within a generally belt-shaped area (the terminal connection area) located in a peripheral part thereof, and the connecting terminals are electrically connected to the electrode terminals on the liquid crystal panel within the area. Of the connecting terminals on each wiring board, terminals (the first wirings) for feeding signals to the pixel section are provided in a longitudinally central portion of the generally belt-like area and terminals (the second wirings) which contribute to signal transfer and reception with the adjacent wiring boards are provided closer to either end of the generally belt-like area than the first wirings. Like this, because the terminal connection area is generally belt-shaped, the connection between the wiring boards and the liquid crystal panel can be achieved collectively. Also, because the terminals contributing to signal transfer and reception in one wiring board are provided close to the terminals contributing to signal transfer and reception in the adjacent wiring boards, the signal transfer and reception between wiring boards can be achieved under very low resistance even in the signal propagation LCD device. Thus, according to the present invention, it becomes possible to do away with the external circuit board, which in turn allows reduction in the component member cost, reduction in the number of process steps by elimination of the connecting process for the external circuit board, enhancement in the rate of conforming articles by the reduction of process steps, reduction in the device thickness and the number of assembly steps by simplification of the module form, and so on.

In at least part of the wiring boards, the first wirings may include a first signal line for feeding a first signal (e.g., counter voltage) to the pixel section, and the second wirings may include a second signal line for feeding the first signal to the adjacent wiring board, the first signal line and the second signal line being electrically connected to each other on the wiring board. With this arrangement, the counter voltage, for example, can be fed to the liquid crystal panel without intersecting any other wirings on the liquid crystal panel. Besides, propagation paths of the counter voltage can be lowered in resistance to a possible minimum.

The first signal line and the second signal line may be electrically connected to each other by means of a jumper bridging other wirings. With this arrangement, the two signal lines can be connected to each other with low resistance and by a simple process. Further, because the two signal lines can be connected without enlarging the area of the wiring board, the picture-frame width of the LCD device can be kept to a minimum.

Alternatively, the first signal line and the second signal line may be electrically connected to each other by means of a routing line at a site outside the terminal connection area. With this arrangement, these two lines can be connected to each other without involving any increase in fabrication process of the wiring board and with low resistance. It is noted that although the first and second signal lines and the routing line have been referred to as separate designations, the first or second signal line may serve also as the routing line.

Additionally to the arrangement described immediately before, two first signal lines may be included within each of the wiring boards, and the two first signal lines may be electrically connected to each other by means of a routing line at a site outside the terminal connection area. With this arrangement, because the first signal fed from the second signal line can be output from two places to the pixel section, the first signal lines themselves can be lowered in resistance, thereby making it possible to prevent delays of the first signal, voltage drops and the like. Further, using this routing line makes it possible for one wiring board to simply transfer the first signal fed from its preceding-stage wiring board to its succeeding wiring board. It is noted that although the first signal lines and the routing line have been referred to as separate designations, either first signal line may serve also as the routing line.

Any one of the second wirings of each wiring board may have an end portion that extends up to a side edge of the wiring board, the side edge facing a side edge of the adjacent wiring board. With this arrangement, the distance between these second wirings on the adjacent wiring boards is made the shortest and eventually the signal transfer and reception between those second wirings is achieved under low resistance. Further, for example, if the second wiring is bent at its opposite end portions as will be described later, end portions of a plurality of second wirings can be made to extend up to the side edge of the wiring board facing its adjacent wiring board. Therefore, signal transfer and reception can be achieved under low resistance with a plurality of wirings.

In one embodiment, the second wirings of each wiring board are electrically connected to the second wirings of the adjacent wiring board by means of connecting lines provided on the liquid crystal panel. With this arrangement, the connecting lines used for signal transfer and reception between wiring boards can be shortened as much as possible and moreover the signal transfer and reception can be achieved under as low resistance as possible.

The connecting lines include high-resistance wirings and low-resistance wirings, and the second signal line of each wiring board may be electrically connected to the second signal line of the adjacent wiring board by means of a low-resistance wiring. With this arrangement, delays of the first signal, voltage drops and the like can be prevented. It is noted here that the term "low-resistance wiring" means a wiring that has a resistance lower than that of the high-resistance wiring. The connecting lines could be classified generally into several types (two types in an embodiment shown in FIG. 2B) in terms of line length, line width and the like, as described later. In such a case, the low-resistance wirings are those belonging to a kind whose resistance is the lowest among the several kinds.

Also, in at least part of the wiring boards, a third wiring having both a function of outputting a signal to the pixel section and a function of contributing to signal transfer and reception with the adjacent wiring board may be located between the first wirings and the second wirings. With this arrangement, the number of connecting terminals between the wiring boards and the liquid crystal panel can be reduced.

Also, those wiring boards may each have two third wirings, and the two third wirings may be electrically connected to each other by means of a routing line at a site outside the terminal connection area. With this arrangement, because the signal fed from the third wiring can be outputted from two places to the pixel section, the third wirings themselves can be lowered in resistance, thereby making it possible to prevent signal delays, voltage drops and the like. Further, use of the routing line makes it possible for one wiring board to simply transfer the signal fed from its preceding-stage wiring board to its succeeding wiring board. It is noted that although the third wirings and the routing line have been referred to as separate designations, the third wiring may be used as the routing line also.

Also, the third wirings of one wiring board may be electrically connected to the third wirings of the adjacent wiring boards by means of connecting lines provided on the liquid crystal panel. With this arrangement, the connecting lines used for signal transfer and reception between wiring boards can be shortened as much as possible and moreover the signal transfer and reception can be achieved under the lowest possible resistance.

Also, in at least part of the wiring boards, a grounding terminal may be exposed at a surface of each wiring board and kept in direct contact with an external grounding terminal. With this arrangement, the connecting resistance can be further lowered.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Embodiment 1

Embodiment 1 of the present invention is described below.

Figure 1A:
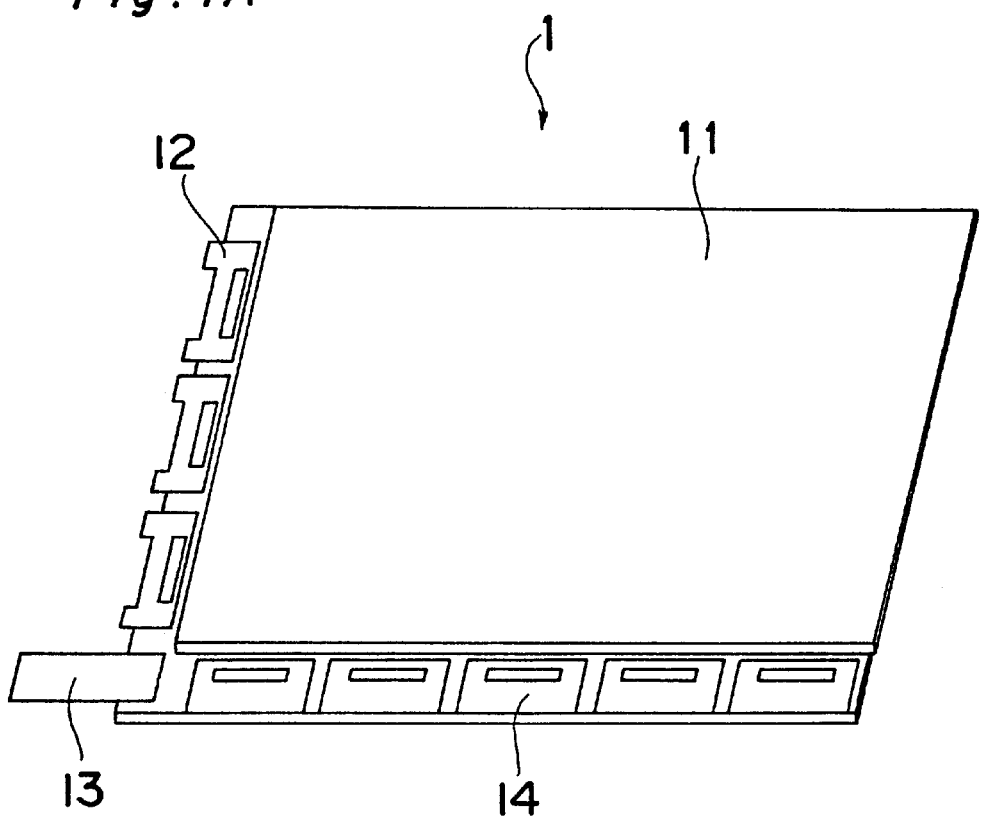
FIGS. 1A and 1B are a schematic explanatory view of an LCD device of Embodiment 1, and a schematic view showing a source TCP to be mounted on the LCD device of Embodiment 1, respectively.
Figure 1B:
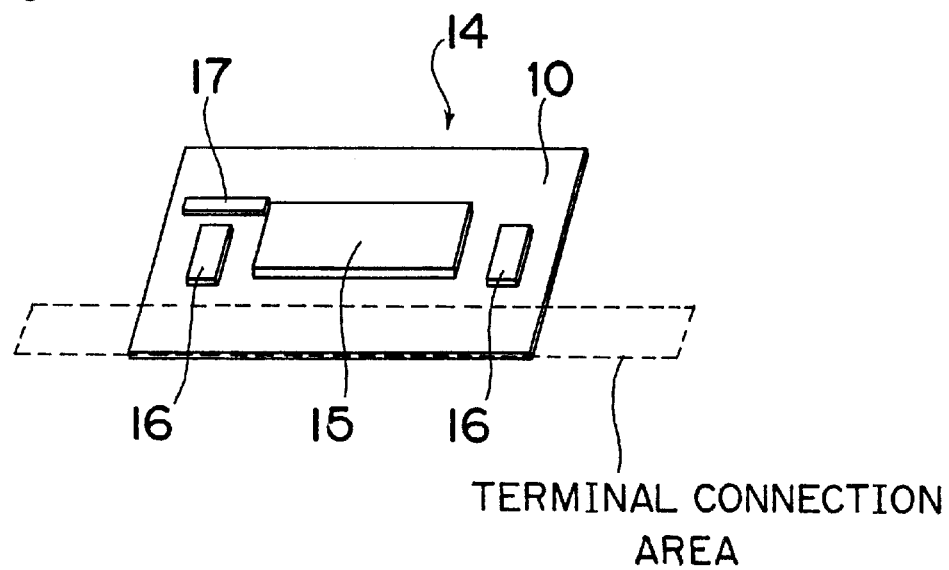

FIG. 1A is a schematic view for explaining an LCD device of this embodiment. FIG. 1B is a schematic view showing a source TCP to be mounted on the LCD device of this embodiment.

Referring to FIG. 1A, the LCD device 1 has a liquid crystal panel 11, gate TCPs 12, a signal input FPC 13 and source TCPs 14. The liquid crystal panel 11 is essentially made up of a plurality of terminals on the periphery which are connected to the gate TCPs 12, the signal input FPC 13 and the source TCPs 14, and a pixel section provided in a central part and serving as a display screen. Hereinbelow, the pixel section is explained on the assumption that a TFT (Thin Film Transistor) LCD panel is used as the liquid crystal display panel 11. On a bottom-side substrate as viewed in the drawings, there are provided a plurality of pixel electrodes, TFT devices provided for the individual pixel electrodes, gate lines for controlling ON/OFF switching of the TFT devices, and source lines for feeding voltage to the pixel electrodes through the associated TFT devices. The gate lines are fed with signals from the gate TCPs and the source lines are fed with signals from the source TCPs. A top-side substrate as viewed in the drawings is provided with a counter-electrode to be opposed to the pixel electrodes. A liquid crystal layer is provided between the top-side substrate and the bottom-side substrate. Display is enabled by feeding voltages to both the plurality of pixel electrodes and the counter-electrode.

Referring to FIG. 1B, the source TCP 14 has, on a flexible substrate 10, a liquid crystal driver IC 15, jumper chips 16, a bypass capacitor 17 and unshown wirings.

In the LCD device of this embodiment, image data signals, power supply voltage for driving the liquid crystal driver ICs, counter voltages for the liquid crystal panel and the like are all introduced from the signal input FPC 13, and the introduced signals propagate sequentially through the wirings within the gate TCPs 12 or the source TCPs 14. Thus, the conventionally employed large-sized external circuit boards are dispensed with in the LCD device of this embodiment.

Next, the circuit pattern of the source TCP 14 and the method of signal propagation to an adjacent TCP in this embodiment are explained.

Figure 2A:
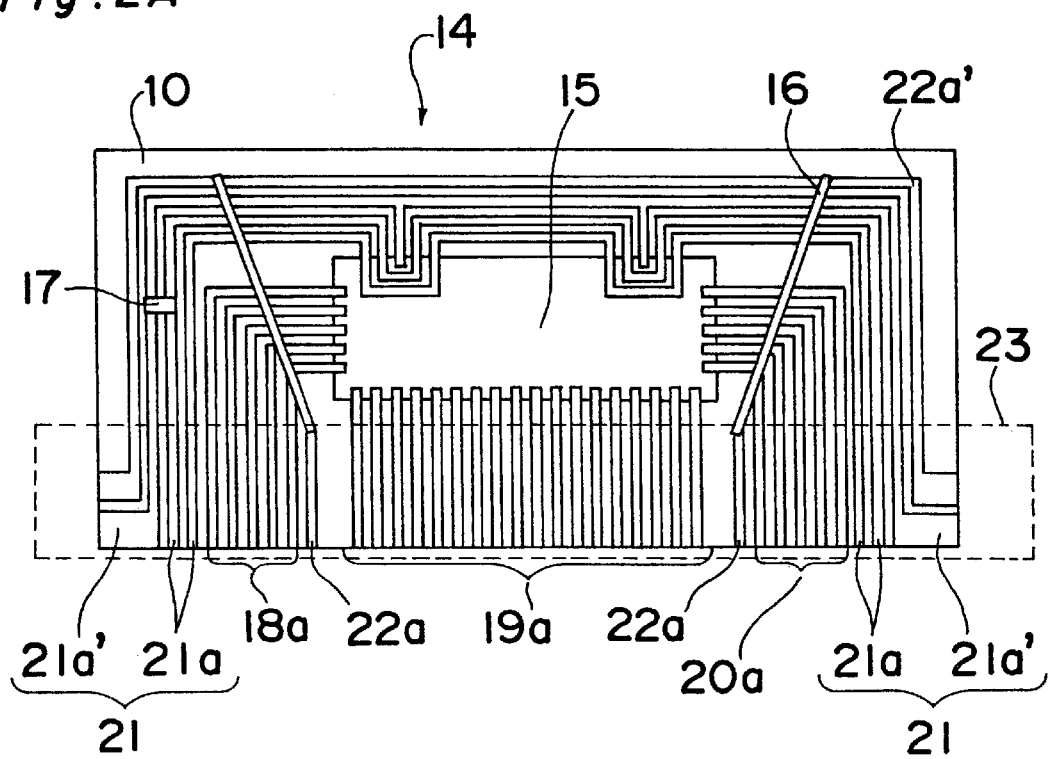
FIGS. 2A and 2B schematically show a circuit pattern of the source TCP of Embodiment 1, and a circuit pattern in a peripheral portion of a liquid crystal panel to which the source TCP of FIG. 2A is connected.
Figure 2B:
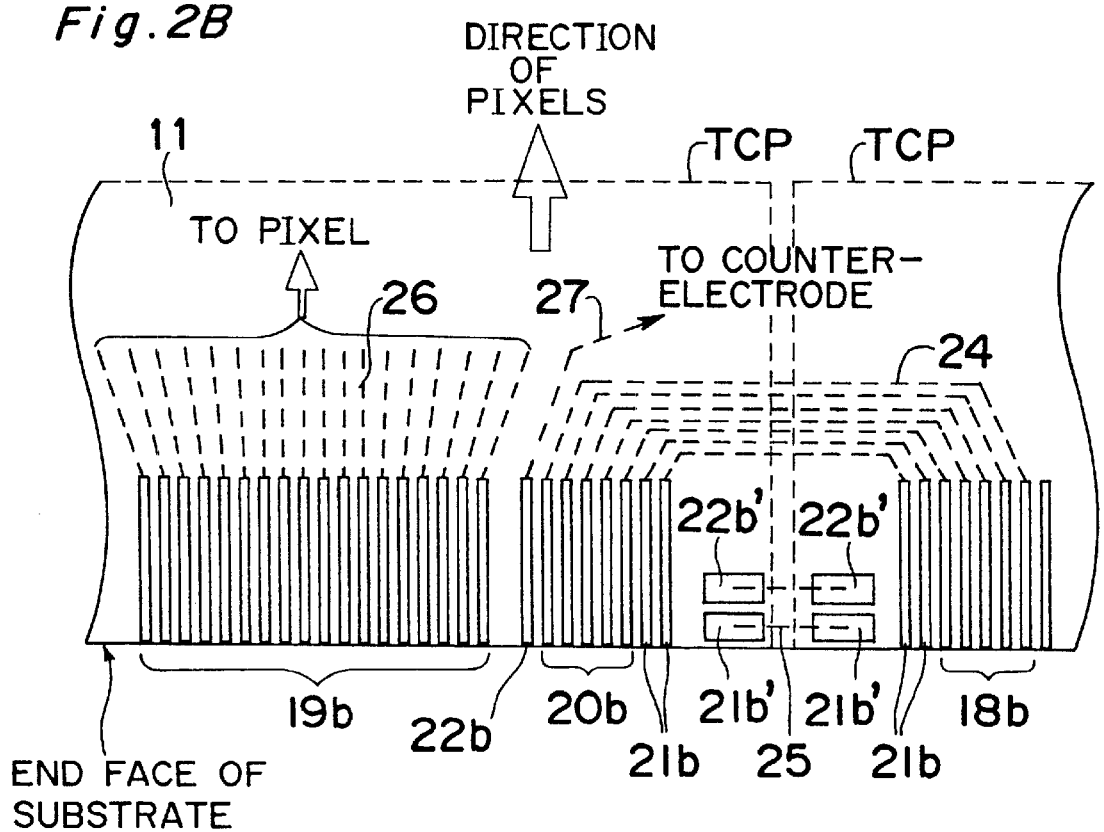

FIGS. 2A and 2B are schematic views for explaining the circuit pattern of the source TCP 14 and the signal propagation paths to the adjacent TCP in this embodiment. FIG. 2A schematically shows the circuit pattern of the source TCP 14, and FIG. 2B shows a circuit pattern in a peripheral portion of the liquid crystal panel to which the source TCP of FIG. 2A is connected.

The source TCP 14 shown in FIG. 2A has a liquid crystal driver IC 15 mounted on the flexible substrate 10. Also, provided around the liquid crystal driver IC 15 are wirings such as signal input lines 18a for inputting signals to the liquid crystal driver IC 15, first signal-output lines 19a for feeding output signals from the liquid crystal driver IC 15 to the liquid crystal panel 11, second signal-output lines 20a for feeding output signals from the liquid crystal driver IC 15 to the next TCP, power supply lines 21 for driving the liquid crystal driver IC 15, and counter-electrode lines 22a and 22a' for feeding counter-electrode signals to the liquid crystal panel 11.

The power supply lines 21 are locally bent or branched so as to be connected to the liquid crystal driver IC 15 in order to feed power supply voltage to the liquid crystal driver IC 15. The power supply lines 21 are also electrically connected to terminals on the adjacent TCP. Thus, the power supply lines 21 have a function of introducing the power supply voltage from the preceding-stage TCP and a function of feeding power supply to the succeeding TCP. Also, these power supply lines 21 are classified roughly into two types, power supply lines 21a and a power supply line 21a', depending on the manner of connection to the adjacent TCP.

In a terminal connection area 23 (shown by dotted line) formed of a generally band-shaped area, the source TCP 14 is connected to terminals provided on the periphery of the liquid crystal panel 11. Some wirings 21a' and 22a', which are located at opposite side areas of the source TCP 14, have their end portions bent, and extend up to the opposite ends of the TCP.

Also, the counter-electrode wirings 22a and 22a' are electrically connected to each other by the jumper chips 16. The jumper chips 16 are connected to lower-layer wirings with an insulating film interposed therebetween, thus having no electrical effects on overlapped wirings.

Further, the bypass capacitor 17 is connected to the power supply lines 21a, 21a'. The provision of the bypass capacitor 17 makes it possible to stabilize the voltage to be fed to the liquid crystal driver IC 15.

Meanwhile, as shown in FIG. 2B, the liquid crystal panel 11 is provided with a plurality of terminals arrayed in correspondence to the arrayed terminals of the source TCP 14 of FIG. 2A. For example, there are provided first signal-output terminals 19b for outputting a signal voltage to the pixel section, second signal-output terminals 20b for feeding output signals of the liquid crystal driver IC 15 to the adjacent TCP, power supply terminals 21b, 21b' for driving the liquid crystal driver IC 15, counter-electrode terminals 22b, 22b' for propagating signals to the counter-electrode, and the like.

The first signal-output terminals 19b are electrically connected to the pixel section via wirings 26. The counter-electrode terminal 22b is electrically connected to the counter-electrode of the liquid crystal panel via a wiring 27. The second signal-output terminals 20b and the power supply terminals 21b are connected to first signal input terminals 18b and the power supply terminals 21b, respectively, belonging to the adjacent TCP via high-resistance wirings 24. Further, the power supply terminal 21b' is electrically connected to a power supply terminal 21b' belonging to the adjacent TCP via a low-resistance wiring 25. It is noted here that the low-resistance wirings 25 refer to wirings which need to be lower in resistance than the high-resistance wirings 24. Generally, in order to lower the electrical resistance of wirings, it is effective to employ a wiring material which itself has a lower resistivity and to optimize the wiring structure (such as broadening line width, increasing the number of lines, or shortening line length). In the present embodiment, the latter technique is adopted to lower the electrical resistance, as described later.

The source TCPs 14 and the liquid crystal panel 11 as described above are electrically connected to each other with an anisotropic conductive film interposed between mutually corresponding connecting terminals within the terminal connection area 23. Further, in this embodiment, since both connecting terminals of the liquid crystal panel 11 and connecting terminals of the source TCPs 14 are arrayed along the longitudinal direction of the TCPs in a generally belt-like form as a whole, the application of anisotropic conductive tape or the like can be achieved very easily.

Next, signal propagation paths of this LCD device are explained. It is noted that a plurality of wirings, which are provided in the wiring board (TCP) to be used in this embodiment, can be classified roughly into the following two types: wirings for outputting signals to the panel and wirings contributing to signal transfer and reception between adjacent wiring boards. Further, the term, "signals," used herein implies at least three signals in its sense, i.e., "image signal voltage" relating to image data to be displayed by pixels of the liquid crystal panel, "counter-electrode power supply voltage" for driving the counter-electrode of the liquid crystal panel, and "IC driving power supply voltage" for driving the IC chip on the wiring board. Therefore, propagation paths for these three kinds of "signals" are described separately below.

(1) Image Signal Voltage:

Signals output from the preceding-stage TCP (Assume that the preceding-stage TCP is on the left hand side in FIG. 2B.) or from the signal input FPC 13 are inputted to the liquid crystal driver IC 15 via the signal input terminals 18b of the liquid crystal panel 11 and the signal input lines 18a of the source TCP 14 associated with the signal input terminals 18b. Signals based on these signals are output from the liquid crystal driver IC 15 toward the pixels via the first signal-output lines 19a of the source TCP 14 and the first signal-output terminals 19b of the liquid crystal panel 11.

Further, signals are output from the liquid crystal driver IC 15 to the next TCP (Assume that the preceding-stage TCP is on the right hand side in FIG. 2B.) via the second signal-output lines 20a, separately from the first signal-output lines 19a. These signals are transferred to the corresponding second signal-output terminals 20b of the liquid crystal panel, and introduced to the signal-input terminals 18b belonging to the succeeding TCP via the high-resistance wirings 24 on the liquid crystal panel 11.

(2) Counter-electrode Power Supply Voltage:

A power supply voltage output from the preceding-stage TCP or the signal input FPC 13 is introduced to one end of the counter-electrode line 22a' of the TCP via the counter-electrode terminal 22b' of the liquid crystal panel 11. The introduced power supply voltage is transferred through a central portion of the counter-electrode line 22a' to the other end thereof. There, the counter-electrode line 22a' is connected to the counter-electrode terminal 22b' formed on the liquid crystal panel 11 side. In this way, the power supply voltage is propagated to the succeeding TCP.

In this connection, a counter-electrode signal needs to be fed to the liquid crystal panel 11 and moreover propagated between TCPs particularly with low resistance. In order to achieve this, this embodiment further has the following characteristic features.

Firstly, the connection to the succeeding-stage TCP is implemented via the low-resistance wiring 25 as shown in FIG. 2B. Since the counter-electrode line 22a' is bent at its opposite end portions and extends up to the opposite side faces of the TCP as described above, the counter-electrode line 22a' of one TCP can be opposed to the counter-electrode line 22a' of the adjacent TCP. Therefore, by straightening the low-resistance wiring 25 used for connection to the succeeding-stage TCP, the line length can be best shortened, and moreover the low-resistance wiring 25 can be lowered in resistance in terms of line length. Further, if opposite end portions of a wiring are bent, and these end portions of this wiring as well as the corresponding terminals on the liquid crystal panel side are formed into an oblong shape or the like, end portions of a plurality of wirings can be extended up to the opposite ends of the wiring board so that the signal transfer and reception can be implemented under low resistance for the plurality of wirings.

Secondly, the counter-electrode lines 22a provided rather closer to the center of the TCP are each electrically connected to the counter-electrode line 22a', which is an outermost wiring in the TCP, via the jumper chips 16. Since the wirings of the TCP are much lower in resistance than the wirings of the liquid crystal panel 11, part of the power supply voltage introduced to the counter-electrode line 22a' can be propagated to the counter-electrode line 22a at low resistance. The power supply voltage fed to the counter-electrode line 22a is further fed to the counter-electrode via the counter-electrode terminal 22b of the liquid crystal panel.

Now the reason why the counter-electrode line 22a is formed rather closer to the center of the TCP is explained below.

Generally, it is considered preferable, in the liquid crystal panel 11, to prevent wirings from intersecting one another (that is, to avoid a multilayered wiring structure) from the viewpoints of reliability, constraints on panel process, and signal propagation precision (signal stability, noise etc.). Taking this into consideration, it is preferable that, of all the interconnections of the liquid crystal panel 11, interconnections used for the signal transfer and reception with the adjacent TCP (i.e., signal input terminals 18b, second signal-output terminals 20b, power supply terminals 21b, 21b', counter-electrode terminal 22b', high-resistance wirings 24 and low-resistance wirings 25 in this embodiment) are formed in the opposite end portions of a TCP, while wiring paths for inputting signals directly to the liquid crystal panel 11 (i.e., first signal-output terminals 19b and counter-electrode terminal 22b, as well as wirings 26, 27 to be connected those terminals in this embodiment) are formed in a central part of the TCP. For this reason, the counter-electrode line 22a is placed rather closer to the center of the TCP.

(3) IC Driving Power Supply Voltage:

The power supply voltage output from the preceding-stage TCP or the signal input FPC 13 is introduced into one end of the power supply lines 21a, 21a' of the source TCP 14 via the power supply terminals 21b, 21b' of the liquid crystal panel 11. The power supply lines 21a, 21a' are locally bent or branched so as to be connected to the liquid crystal driver IC 15. The introduced power supply voltage is then transferred to the other end of the power supply lines 21a, 21a'. Further, the end portions of the power supply lines 21a, 21a' are connected to the power supply terminals 21b, 21b' on the liquid crystal panel 11 side, so that the power supply voltage is introduced to the next TCP.

The connection between the power supply lines 21 and the succeeding-stage TCP in this embodiment is implemented by means of the high-resistance wirings 24 and the low-resistance wirings 25 as shown in FIG. 2B. Whether the high-resistance wiring 24 or the low-resistance wiring 25 should be used is decided based on the type of the signal to be propagated (that is, based on the margin of voltage drop). However, without being necessarily limited to this constitution, wirings having similar resistance values may be used for the connection if different signals have similar voltage drop margins.

Further, since the ends of the power supply line 21a' are similar in configuration to the counter-electrode line 22a' as described above, the low-resistance wiring 25 to be used for the connection of the power supply line 21a' to the adjacent TCP is straightened so that its line length can be made shortest. Hence, the low-resistance wirings 25 can be further lowered in resistance. Furthermore, if opposite end portions of a wiring are bent, and these end portions of this wiring as well as the corresponding terminals on the liquid crystal panel side are formed into an oblong shape or the like as in the present embodiment, end portions of a plurality of wirings can be extended up to the opposite ends of the wiring board so that the signal transfer and reception can be implemented under low resistance for the plurality of wirings.

With the arrangement as described above, wirings that need to propagate signals among TCPs especially under low resistance are connected to the adjacent TCP by means of low-resistance wirings, while terminals having relatively high tolerance of resistance value are connected to the adjacent TCP by means of high-resistance wirings.

Next, the circuit pattern of the gate TCP and the method of signal propagation to the adjacent TCP in this embodiment are explained.

Figure 3A:
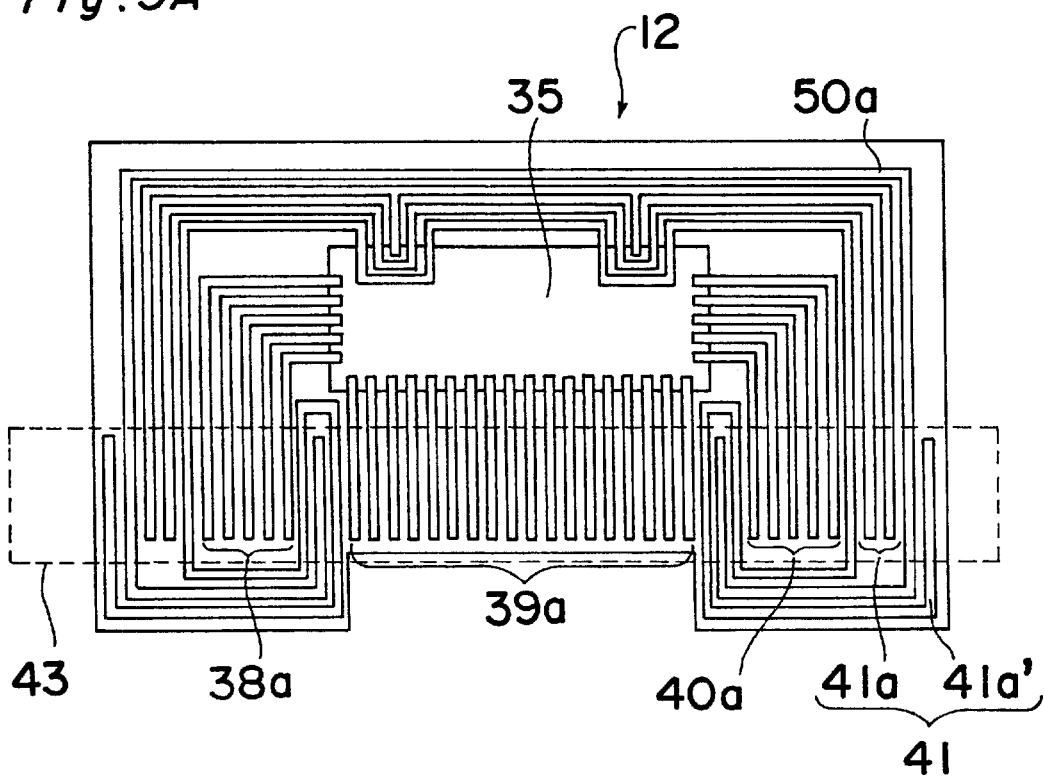
FIGS. 3A and 3B schematically show a circuit pattern of a gate TCP of Embodiment 1, and a circuit pattern in a peripheral portion of a liquid crystal panel to which the gate TCP of FIG. 3A is connected.
Figure 3B:
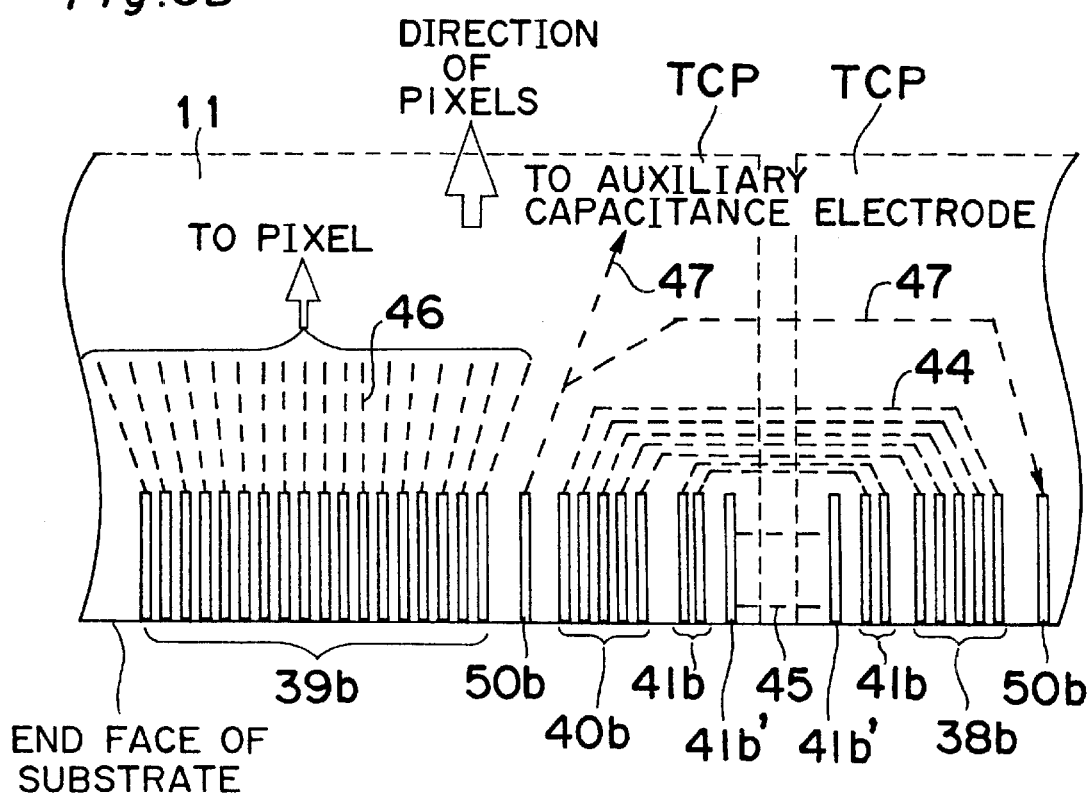

FIGS. 3A and 3B are schematic views for explaining the circuit pattern of the gate TCP 12 and the signal propagation paths to the adjacent TCP in this embodiment. FIG. 3A schematically shows the circuit pattern of the gate TCP 12, and FIG. 3B shows a circuit pattern in a peripheral portion of the liquid crystal panel to which the gate TCP of FIG. 3A is connected.

Referring to FIG. 3A, the gate TCP 12 is mounted with a liquid crystal driver IC 35. Also, the following wirings are provided around this liquid crystal driver IC 35: signal input lines 38a for introducing signals from the preceding-stage TCP to the liquid crystal driver IC 35, first signal-output lines 39a for feeding output signals from the liquid crystal driver IC 35 to the liquid crystal panel 11, second signal-output lines 40a for feeding output signals from the liquid crystal driver IC 35 to the adjacent TCP, power supply lines 41 for driving the liquid crystal driver IC 35, and a direct input line 50a for introducing a signal directly to the liquid crystal panel 11 without passing it through the liquid crystal driver IC 35.

The power supply lines 41, as in the case of the source TCP 14 as described above, are locally bent or branched so as to be connected to the liquid crystal driver IC 35 in order to feed signals to the liquid crystal driver IC 35. The power supply lines 41 are connected also to terminals of the adjacent TCP 12 so as to feed signals to the succeeding-stage TCP one after another. Also, these power supply lines 41 are classified roughly into two types, namely, power supply lines 41a and a power supply line 41a', depending on the manner of connection to the adjacent TCP.

In its generally belt-shaped terminal connection area 43 (shown by dotted line), the gate TCP 12 is connected to terminals provided on the periphery of the liquid crystal panel 11. As in the case shown in FIGS. 2A and 2B, the connection between the gate TCP and the liquid crystal panel of FIGS. 3A and 3B is also implemented in a generally belt-like area extending along the length of the gate TCP 12 and of a substrate edge of the liquid crystal panel 11. Thus, the connecting process can be much simplified.

The power supply line 41a' formed innermost of all the power supply lines 41 is routed downward, as viewed in the drawing, of the terminal connection area 43 twice and upward of it once, in such a manner as to surround end portions of the direct input line 50a. As a result, the opposite end portions of the power supply line 41a' are positioned closest to opposite outermost lateral sides of the TCP. Meanwhile, the direct input line 50a, the major part of which is formed closer to outer edges of the TCP than the power supply lines 41, is bent at a proximity of the terminal connection area 43, so that the opposite end portions of the direct input line 50a are each drawn closer to the center of the TCP.

Meanwhile, as shown in FIG. 3B, in the liquid crystal panel 11, a plurality of electrode terminals are arrayed in correspondence to arrayed terminals of the gate TCP 12 shown in FIG. 3A. For example, there are provided signal input terminals 38b for transferring signals from the preceding-stage TCP or the signal input FPC 13 to the current TCP, first signal-output terminals 39b for outputting signals to the pixel section, second signal-output terminals 40b for feeding output signals of the liquid crystal driver IC 35 to the adjacent TCP, a direct input signal terminal Sob, and the like.

The first signal-output terminals 39b are electrically connected to the pixel section via wirings 46. The direct input terminal 50b is electrically connected to the pixel section via a wiring 47. Also, the terminal 50b is electrically connected to the direct input signal terminal 50b for the adjacent TCP by means of a wiring branched from the wiring 47, and to the direct input line 50a. In this embodiment, the direct input line 50a and the direct input terminal 50b are intended to propagate signals dedicated for auxiliary capacitance electrodes, but not limited to this. Further, in the region between the wirings 46 and high-resistance wirings 44, wiring density is relatively low, thus making it relatively easy to adjust the resistance value by broadening the line width of the wiring 47 as required.

The second signal-output terminals 40b and power supply terminals 41b are connected to the first signal input terminals 38b and the power supply terminals 41b for the adjacent TCP, respectively, via the high-resistance wirings 44. Further, a power supply terminal 41b' is connected to a power supply terminal 41b' for the adjacent TCP via low-resistance wiring 45.

With the constitution as described above, power supply terminals (for the power supply and counter-electrode) that need to propagate signals among TCPs under low resistance are connected to the adjacent TCP by means of low-resistance wirings, while terminals having relatively high allowance of resistance value are connected to the adjacent TCP by means of high-resistance wirings.

Also, because the wirings neither intersect one another nor are multi-layered both in the liquid crystal panel 11 and in the gate TCP 12, high reliability and low fabrication cost result.

The number and usage of the wirings are not limited to those of the embodiment. Further, the source TCP and the gate TCP have been described independently of each other, but these TCPs are not limited to the described structure. Furthermore, although above embodiment has been described with respect to TCPs alone, yet the invention is not limited to this and any kind of package in which a liquid crystal driver IC is mounted on an FPC may be used as a matter of course.

Embodiment 2

Another embodiment of the invention is described with reference to FIGS. 4 and 5.

Figure 4A:
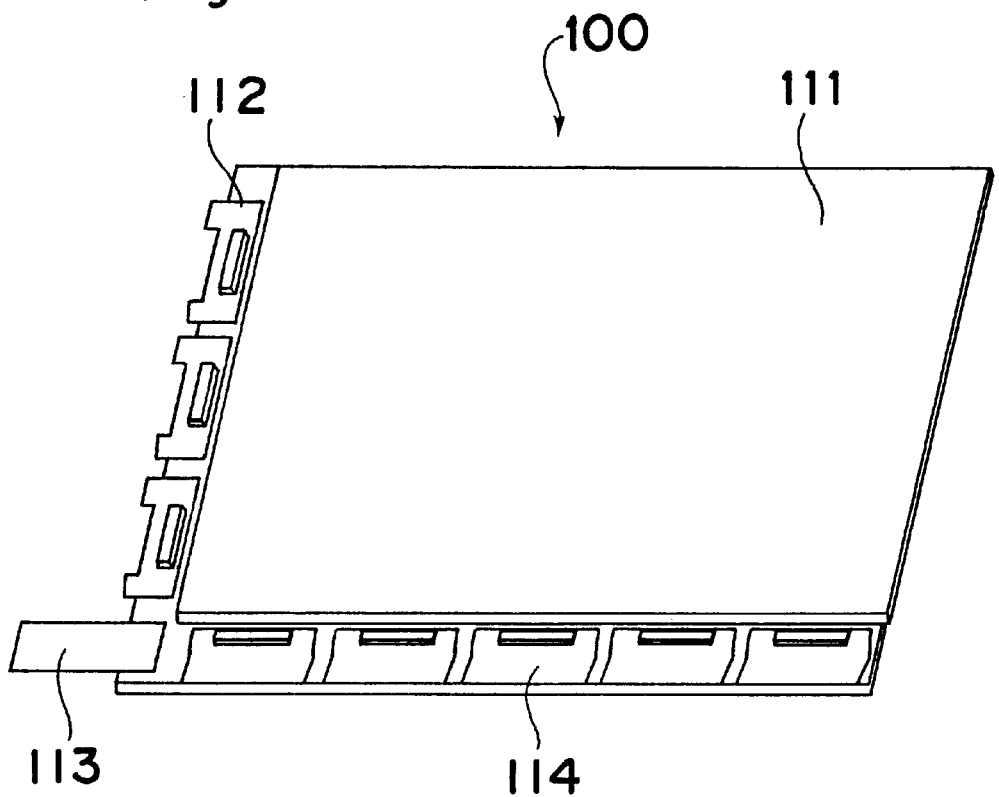
FIGS. 4A and 4B are a schematic explanatory view of an LCD device of Embodiment 2, and a schematic view showing a source TCP to be mounted on the LCD device of Embodiment 2, respectively.
Figure 4B:
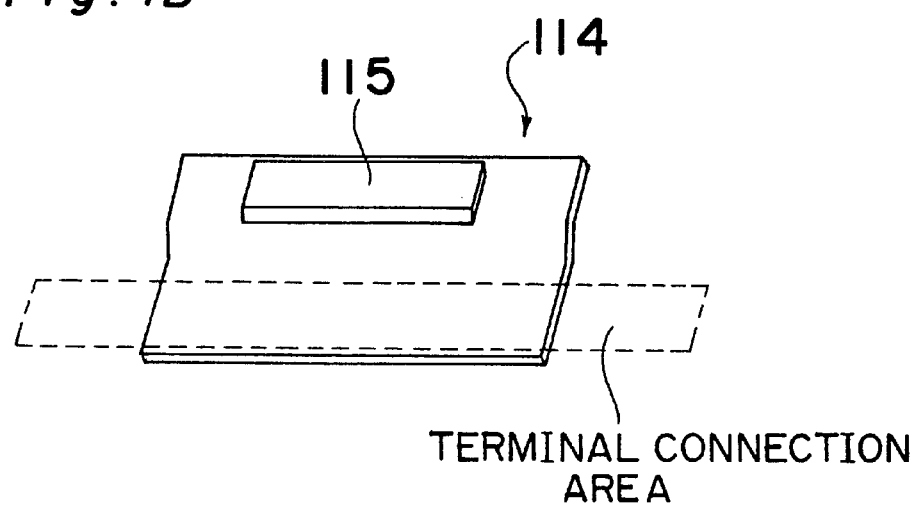

FIG. 4A is a schematic view for explaining an LCD device of this embodiment. FIG. 4B is a schematic view showing a source TCP to be mounted on the LCD device of this embodiment.

Referring to FIG. 4A, the LCD device 100 is essentially made up of a liquid crystal panel 111, gate TCPs 112, a signal input FPC 113, and source TCPs 114.

Referring to FIG. 4B, the source TCP 114 has a liquid crystal driver IC 115 and unshown interconnections or wirings mounted on a flexible substrate.

In this embodiment also, signals necessary for display of an image, IC driving power supply voltage, counter-electrode driving power supply voltage for the liquid crystal panel, and the like, are all supplied from the signal input FPC 113, and these signals propagate through the gate TCPs 112 or the source TCPs 114 one after another, thereby dispensing with the conventionally employed large-sized external circuit board.

Next, the circuit pattern of the source TCP 14 and the method of signal propagation to the succeeding-stage adjacent TCP in this embodiment are explained.

Figure 5A:
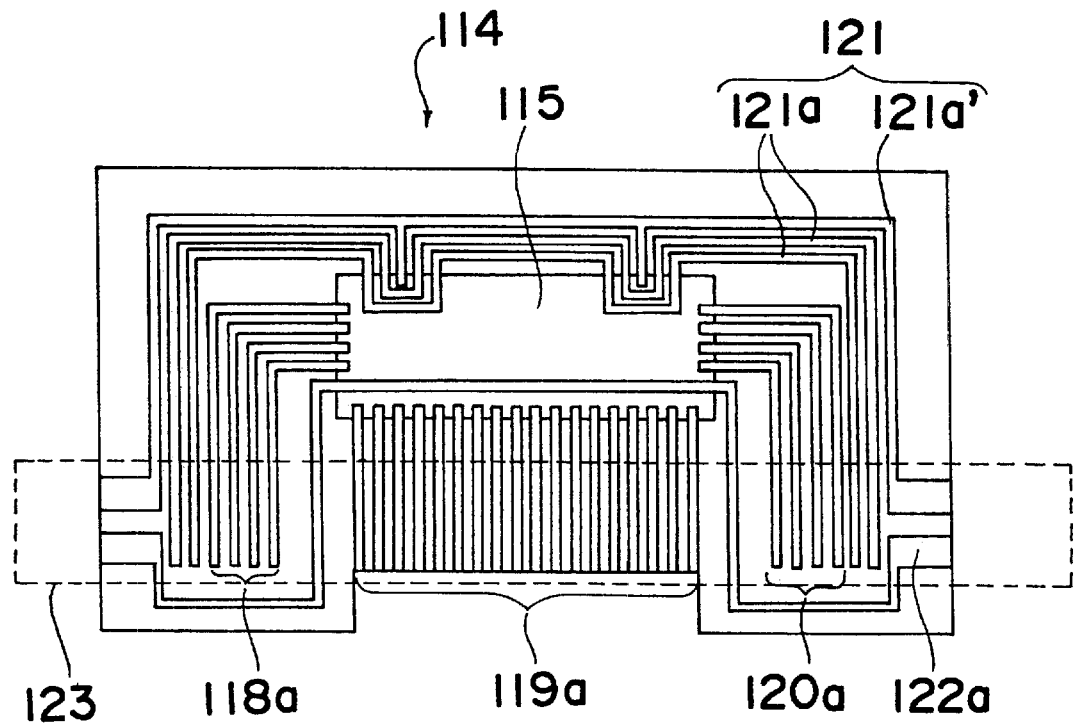
FIGS. 5A and 5B schematically show a circuit pattern of the source TCP of Embodiment 2, and a circuit pattern in a peripheral portion of a liquid crystal panel to which the source TCP of FIG. 5A is connected.
Figure 5B:
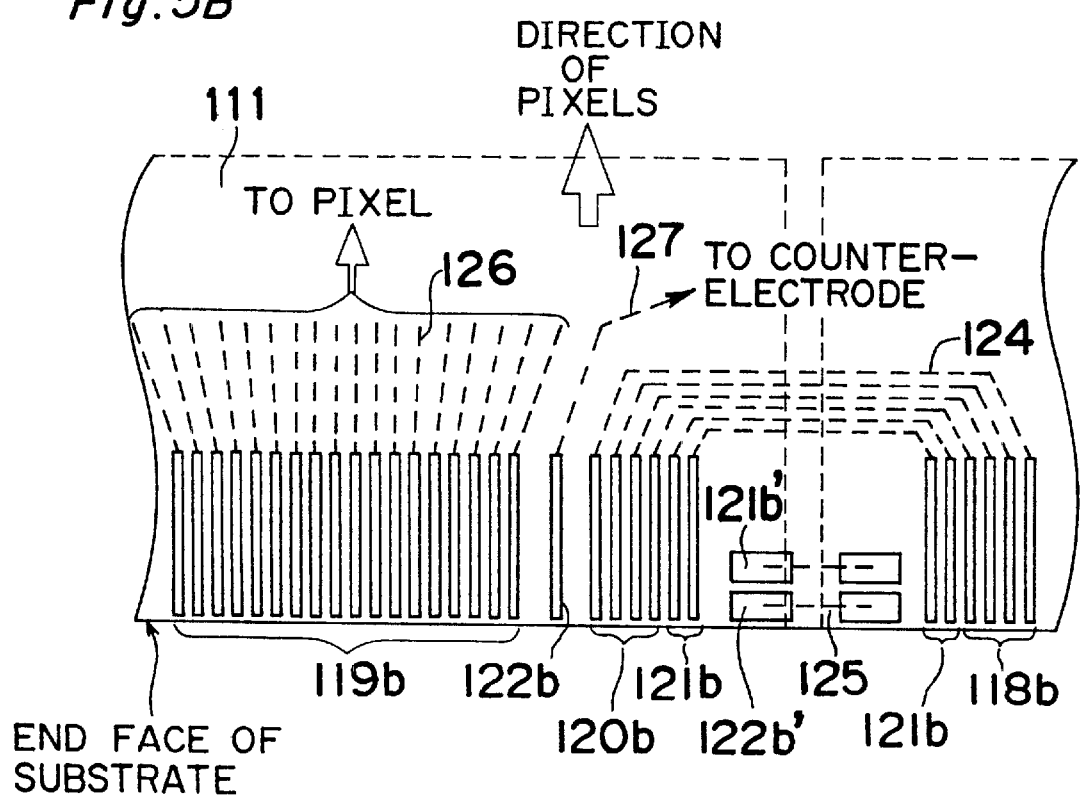

FIGS. 5A and 5B are schematic views for explaining the circuit pattern of the source TCP 114 and the signal propagation paths to the preceding-stage TCP in this embodiment. FIG. 5A schematically shows the circuit pattern of the source TCP, and FIG. 5B shows a circuit pattern in a peripheral portion of the liquid crystal panel to which the source TCP of FIG. 5A is connected.

Referring to FIG. 5A, the source TCP 114 is mounted with a liquid crystal driver IC 115. Also, around this liquid crystal driver IC 115 are provided signal input lines 118a for supplying signals to the liquid crystal driver IC 115, first signal-output lines 119a for feeding output signals of the liquid crystal driver IC 115 to the liquid crystal panel 111, second signal-output lines 120a for feeding output signals of the liquid crystal driver IC 115 to the adjacent TCP, power supply lines 121 for driving the liquid crystal driver IC 115, and a counter-electrode line 122a for feeding a counter-electrode signal to the liquid crystal panel 111.

The power supply lines 121 are locally bent or branched so as to be connected to the liquid crystal driver IC 115 in order to feed the power supply voltage to the liquid crystal driver IC 115. The power supply lines 121 are also connected to terminals for the succeeding-stage TCP so as to feed the power supply voltage thereto. Also, these power supply lines 121 are classified roughly into two types, power supply lines 121a and a power supply line 121a', depending on the manner of connection to the adjacent TCP.

In a generally belt-shaped terminal connection area 123 (shown by dotted line), the source TCP 114 is connected to terminals provided on the periphery of the liquid crystal panel 111.

The power supply line 121a' provided in an outer portion of the source TCP 114 is bent at its end portions within the terminal connection area 123, with the end portions of the power supply line 121a' extending up to the laterally opposite ends of the TCP.

In this embodiment, the counter-electrode line 122a has a central portion placed in a lower part of the liquid crystal driver IC 115 (on the side of connection to the flexible substrate). Also, part of the counter-electrode line 122a is let or routed outside the terminal connection area 123 so that the opposite end portions of the counter-electrode line 122a are placed in the opposite lateral side portions of the TCP.

On the other hand, in the liquid crystal panel 111, a plurality of electrode terminals are arrayed in correspondence to arrayed terminals of the source TCP 114, as shown in FIG. 5B. For example, there are provided first signal-output terminals 119b for feeding signals of the liquid crystal driver IC 115 to the pixel section of the panel, second signal-output terminals 120b for feeding output signals of the liquid crystal driver IC 115 to the succeeding-stage TCP, power supply terminals 121b, 121b' for driving the liquid crystal driver IC 115, and counter-electrode terminals 122b, 122b' for propagating a signal to the counter-electrode.

The first signal-output terminals 119b are electrically connected to the pixel section via wirings 126. The counter-electrode terminal 122b is electrically connected to the counter-electrode of the liquid crystal panel 111 via wiring 127. The second signal-output terminals 120b and the power supply terminals 121b are electrically connected to the first signal input terminals 118b and the power supply terminals 121b associated with the adjacent TCP, by means of high-resistance wirings 124, respectively. Further, the power supply terminal 121b' and the counter-electrode terminal 122b' are connected to a power supply terminal 121b' and a counter-electrode terminal 122b' associated with the adjacent TCP, by means of low-resistance wirings 125, respectively.

As described above, terminals that need to propagate signals among TCPs particularly under low resistance are connected to the adjacent TCP by means of the low-resistance wirings 125, while terminals having relatively high tolerance of electrical resistance are connected to the adjacent TCP by means of the high-resistance wirings 124. In the counter-electrode line 122a, its opposite end portions that extend up to the opposite lateral ends of the TCP flexible substrate are tied up by its central wiring portion which is formed within the TCP. Thus, the counter-electrode signal is allowed to be propagated among a plurality of TCPs at low resistance.

The source TCP of this embodiment has the liquid crystal driver IC 115 and wirings or interconnections formed on one side of a flexible substrate. However, it should not be particularly limited on which side of the flexible substrate the wirings and the chip are formed.

The wiring structure on the gate side may be similar to that of Embodiment 1. However, this is not limitative.

Embodiment 3

A further embodiment of the present invention is described below.

Figure 6A:
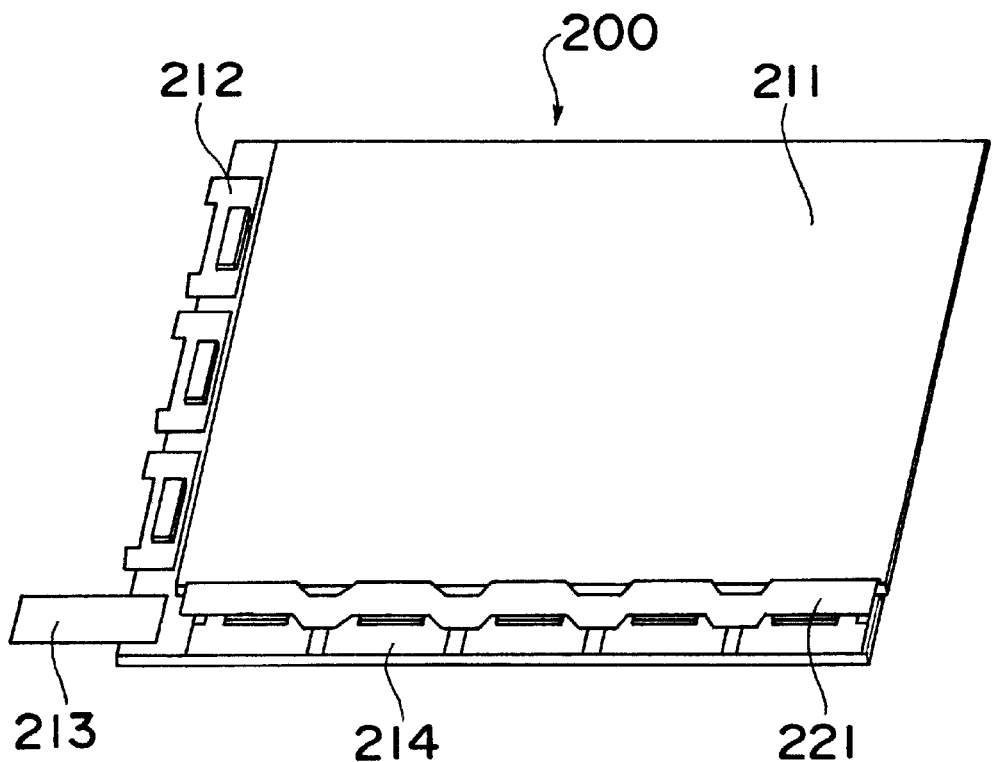
FIGS. 6A and 6B are a schematic explanatory view of an LCD device of Embodiment 3, and a schematic view showing a source TCP to be mounted on the LCD device of Embodiment 3, respectively.

Referring to FIG. 6A, an LCD device 200 is essentially made up of a liquid crystal panel 211, gate TCPs 212, a signal input FPC 213, source TCPs 214 and a GND electrode 221.

Figure 6B:
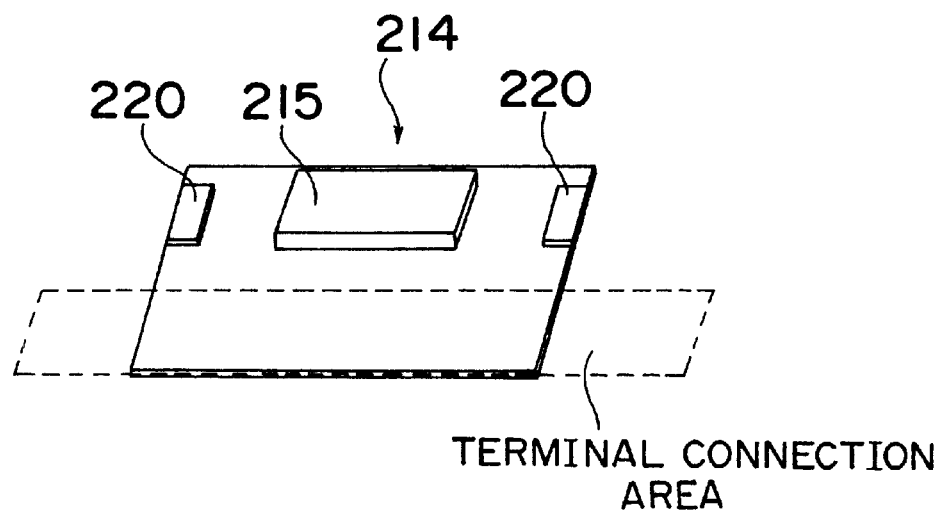
Figure 7A:
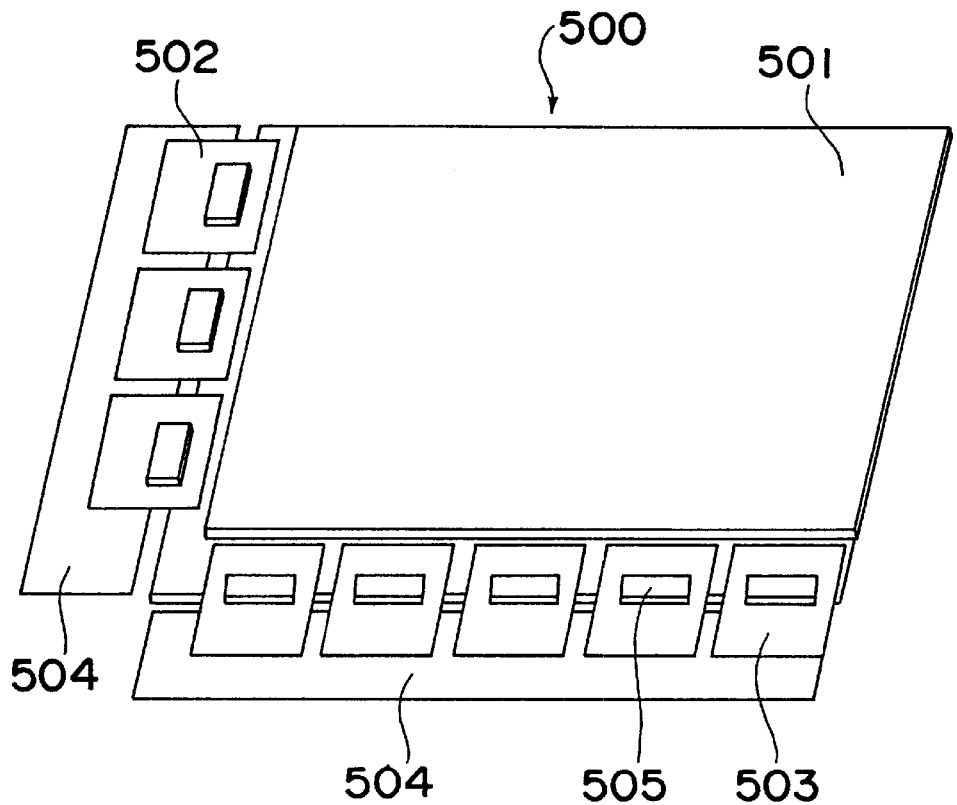
FIGS. 7A and 7B schematically show the arrangement of an LCD device according to a background art, and FIGS. 8A and 8B schematically show the arrangement of an LCD device according to a background art.
Figure 7B:
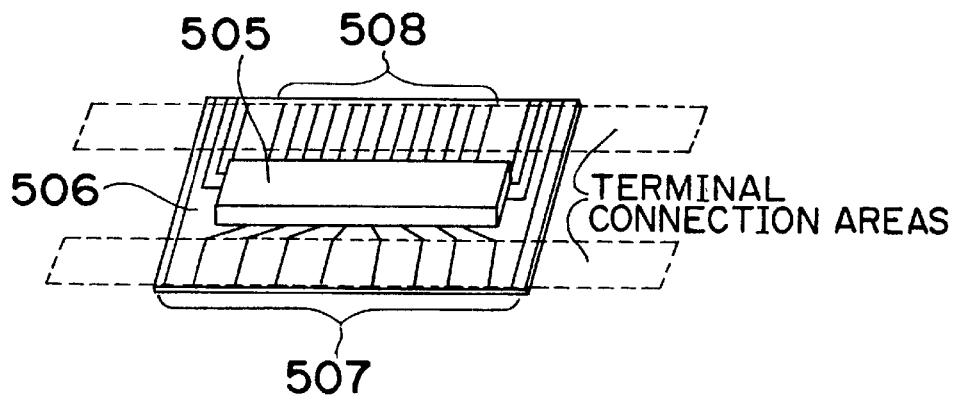
Figure 8A:
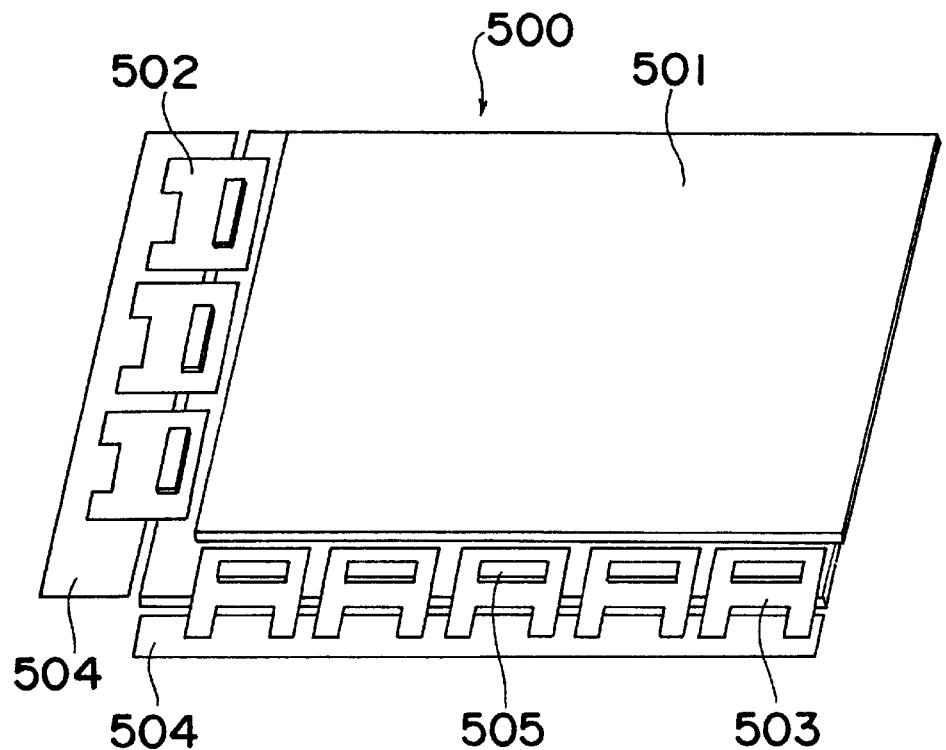
Figure 8B:
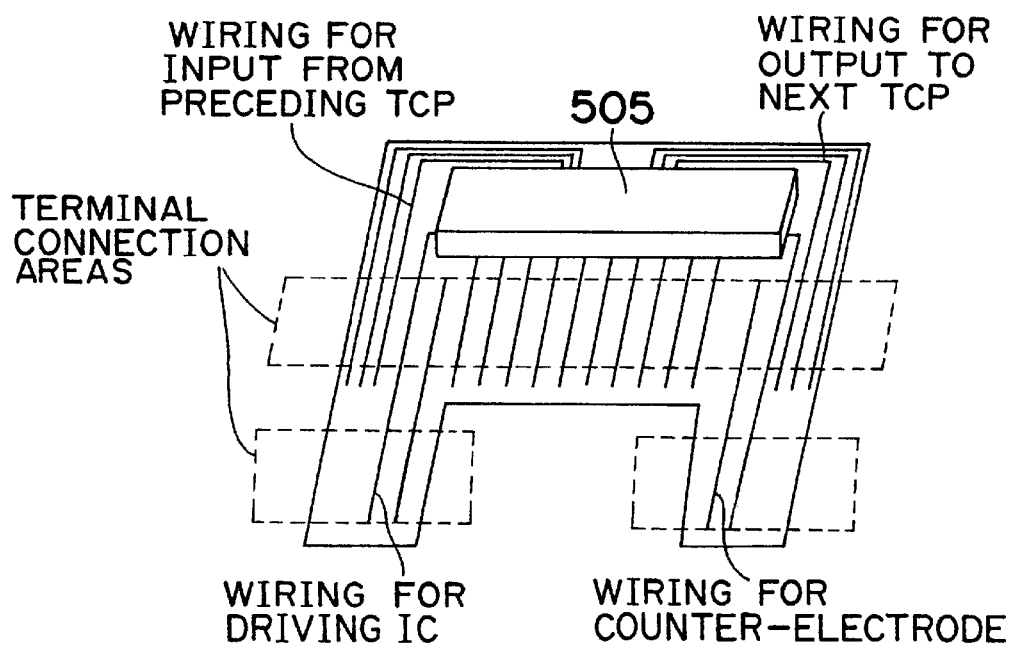

Referring to FIG. 6B, the source TCP 214 has a liquid crystal driver IC 215 and pads 220 provided on a flexible substrate, each pad 220 having a GND pattern exposed at a surface of the substrate.

In Embodiment 3, the pads 220 of the TCP are in contact with the GND electrode 221 so as to be at a common potential, thereby stabilizing the GND potential. The GND electrode 221 may also be integrated with the bezel of the LCD device. In addition, the source TCP and the gate TCP have the same wiring structure as that of Embodiment 1 or 2.

Embodiment 3 is effective for cases where the interconnect resistance cannot be reduced enough even by the techniques of Embodiments 1 and 2. Adopting the technique of Embodiment 3 is effective particularly when the interconnect resistance is increased due to increased panel size, or when the driving frequency is increased due to higher definition.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A liquid crystal display device comprising:
    a liquid crystal panel having a plurality of electrode terminals provided in a peripheral part thereof and a pixel section provided in a central part thereof; and
    a plurality of wiring boards each provided with a liquid crystal driver IC and wirings, wherein
        said wirings comprise first wirings for supplying signals to said pixel section and second wirings contributing to signal transfer and reception between mutually adjacent wiring boards;
        said plurality of wiring boards each have one generally belt-shaped terminal connection area extending along one longitudinal edge of the wiring board; and
        said first wirings are electrically connected to their respective corresponding electrode terminals of the liquid crystal panel in a lengthwise central part of the terminal connection area and extending up to at least almost said one longitudinal edge of the wiring board; while said second wirings are electrically connected to their respective corresponding electrode terminals of the liquid crystal panel in both lengthwise end portions of the terminal connection area,
        wherein in at least part of the wiring boards, the first wirings include a first signal line for feeding a first signal to the pixel section, and the second wirings include a second signal line for feeding the first signal to the adjacent wiring board, the first signal line and the second signal line being electrically connected to each other.

2. The liquid crystal display device according to claim 1, wherein the first signal line and the second signal line, between which wirings are disposed, are electrically connected to each other by means of a jumper.

3. The liquid crystal display device according to claim 1, wherein any one of the second wirings of each wiring board has an end portion that extends up to a side edge of the wiring board, said side edge facing a side edge of the adjacent wiring board.

4. The liquid crystal display device according to claim 1, wherein at least part of the wiring boards, a third wiring is located between the first wirings and the second wirings, said third wiring having both a function of outputting a signal to the pixel section and a function of contributing to signal transfer and reception with the adjacent wiring board.

5. The liquid crystal display device according to claim 1, wherein said third wiring comprises two wirings, and these two wirings are electrically connected to each other by means of a routing line at a site outside the terminal connection area.

6. The liquid crystal display device according to claim 1, wherein at least part of the wiring boards, a grounding terminal is exposed at a surface of each wiring board.

7. A liquid crystal display device comprising:
a liquid crystal panel having a plurality of electrode terminals provided in a peripheral part thereof and a pixel section provided in a central part thereof; and
a plurality of wiring boards each provided with a liquid crystal driver IC and wirings, wherein
said wirings comprise first wirings for supplying signals to said pixel section and second wirings contributing to signal transfer and reception between mutually adjacent wiring boards;
said plurality of wiring boards each have one generally belt-shaped terminal connection area extending along one longitudinal edge of the wiring board;
said first wirings are electrically connected to their respective corresponding electrode terminals of the liquid crystal panel in a lengthwise central part of the terminal connection area, while said second wirings are electrically connected to their respective corresponding electrode terminals of the liquid crystal panel in either lengthwise end portion of the terminal connection area;
in at least part of the wiring boards, the first wirings include a first signal line for feeding a first signal to the pixel section, and the second wirings include a second signal line for feeding the first signal to the adjacent wiring board, the first signal line and the second signal line being electrically connected to each other; and
wherein the first signal line and the second signal line are electrically connected to each other by means of a first routing line at a site outside the terminal connection area.

8. The liquid crystal display device according to claim 7, wherein said first signal line comprises two signal lines, and the two signal lines are electrically connected to each other by means of a second routing line at a site outside the terminal connection area.

9. The liquid crystal display device according to claim 7, wherein any one of the second wirings of each wiring board has an end portion that extends up to a side edge of the wiring board, said side edge facing a side edge of the adjacent wiring board.

10. The liquid crystal display device according to claim 9, wherein at least part of the wiring boards, a third wiring is located between the first wirings and the second wirings, said third wiring having both a function of outputting a signal to the pixel section and a function of contributing to signal transfer and reception with the adjacent wiring board.

11. The liquid crystal display device according to claim 10, wherein said third wiring comprises two wirings, and these two wirings are electrically connected to each other by means of a routing line at a site outside the terminal connection area.

12. The liquid crystal display device according to claim 9, wherein at least part of the wiring boards, a grounding terminal is exposed at a surface of each wiring board.

13. The liquid crystal display device according to claim 7, wherein the second wirings of each wiring board are electrically connected to the second wirings of the adjacent wiring board by means of first connecting lines provided on the liquid crystal panel.

14. The liquid crystal display device according to claim 13, wherein said first connecting lines include high-resistance wirings and low-resistance wirings, and a portion of the second wirings of each wiring board are electrically connected to corresponding portions of the second wirings of the adjacent wiring board by means of a low-resistance wiring.

15. The liquid crystal display device according to claim 7, wherein in at least part of the wiring boards, a grounding terminal is exposed at a surface of each wiring board.

16. The liquid crystal display device according to claim 7, wherein said first connecting lines include high-resistance wirings and low-resistance wirings and a portion of the second wirings of each wiring board are electrically connected to corresponding portions of the second wirings of the adjacent wiring board by means of a low-resistance wiring.

* * * * *